(12) United States Patent
Naem

(10) Patent No.: US 6,784,099 B1
(45) Date of Patent: Aug. 31, 2004

(54) DUAL-SIDED SEMICONDUCTOR DEVICE AND METHOD OF FORMING THE DEVICE WITH A RESISTIVE ELEMENT THAT REQUIRES LITTLE SILICON SURFACE AREA

(75) Inventor: Abdalla Aly Naem, Overijse (BE)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/091,982

(22) Filed: Mar. 6, 2002

Related U.S. Application Data

(63) Continuation-in-part of application No. 09/802,148, filed on Mar. 8, 2001, now Pat. No. 6,479,382.

(51) Int. Cl.[7] ............................................. H01L 21/44
(52) U.S. Cl. ...................... 438/658; 438/660; 438/667; 438/928
(58) Field of Search ................................ 438/658, 660, 438/667, 928

(56) References Cited

U.S. PATENT DOCUMENTS

| | | | |
|---|---|---|---|
| 3,928,093 A | 12/1975 | Van Tongerloo et al. | 148/186 |
| 3,937,579 A | 2/1976 | Schmidt | 356/144 |
| 4,189,820 A | 2/1980 | Slack | 29/425 |
| 4,261,781 A | 4/1981 | Edmonds et al. | 156/254 |
| 4,782,028 A | 11/1988 | Farrier et al. | 437/3 |
| 5,142,756 A | 9/1992 | Ibaraki et al. | 29/25.01 |
| 5,166,097 A | 11/1992 | Tanielian | 437/203 |
| 5,240,882 A | 8/1993 | Satoh et al. | 437/226 |
| 5,250,460 A | 10/1993 | Yamagata et al. | 437/62 |
| 5,362,683 A | 11/1994 | Takenaka et al. | 437/226 |
| 5,496,755 A * | 3/1996 | Bayraktaroglu | 438/167 |
| 5,530,552 A | 6/1996 | Mermagen et al. | 356/401 |
| 5,608,237 A | 3/1997 | Aizawa et al. | 257/132 |
| 5,739,067 A | 4/1998 | DeBusk et al. | 438/618 |
| 5,814,889 A * | 9/1998 | Gaul | 257/773 |
| 6,010,951 A | 1/2000 | Pushpala et al. | 438/458 |
| 6,110,825 A | 8/2000 | Mastromatteo et al. | 438/667 |
| 6,187,677 B1 | 2/2001 | Ahn | 438/667 |
| 6,221,769 B1 | 4/2001 | Dhong et al. | 438/667 |
| 6,479,382 B1 * | 11/2002 | Naem | 438/658 |

FOREIGN PATENT DOCUMENTS

| JP | 6419729 | 1/1989 | ......... H01L/21/304 |

* cited by examiner

Primary Examiner—Michael S. Lebentriti
Assistant Examiner—Christian D. Wilson
(74) Attorney, Agent, or Firm—Mark C. Pickering

(57) ABSTRACT

A dual-sided semiconductor device is formed on a wafer with a resistive element that is formed through the wafer. By forming the resistive element through the wafer, a resistive element, such as a large resistive element, can be formed on the wafer that requires very little silicon surface area.

15 Claims, 8 Drawing Sheets

DUAL-SIDED SEMICONDUCTOR DEVICE AND METHOD OF FORMING THE DEVICE WITH A RESISTIVE ELEMENT THAT REQUIRES LITTLE SILICON SURFACE AREA

RELATED APPLICATION

The present application is a continuation-in-part of Application Ser. No. 09/802,148 filed Mar. 8, 2001, now U.S. Pat. No. 6,479,382 by Abdalla Aly Naem for Dual-Sided Semiconductor Chip and Method for Forming the Chip with a Conductive Path Through the Chip that Connects Elements on Each Side of the Chip.

BACKGROUND OF THE INVENTION

1. Field of the Invention.

The present invention relates to a dual-sided semiconductor device and a method for forming the device and, more particularly, to a dual-sided semiconductor device and a method for forming the device with a resistive element that requires very little silicon surface area.

2. Description of the Related Art.

A dual-sided semiconductor device is a device that has electrical circuits on both sides of a wafer. Thus, unlike more conventional semiconductor devices that utilize only one side of a wafer, a dual-sided device utilizes both sides of the wafer. As a result, packaged dual-sided semiconductor devices consume significantly less circuit-board real estate than conventional single-sided devices.

FIG. 1 shows a cross-sectional drawing that illustrates a dual-sided semiconductor device 100. As shown in FIG. 1, device 100 includes a wafer 110 that has a top side 112 and a bottom side 114. As further shown in FIG. 1, device 100 also has electrical circuits 120 which are formed on top side 112, and electrical circuits 122 which are formed on bottom side 114. Electrical circuits 120 and 122 typically communicate with the outside world via wires that are connected to pads that form a part of circuits 120 and 122.

Thus, as shown in FIG. 1, circuits 120 and 122 both share the central portion of wafer 110. As a result, whatever voltage is present on the central portion of wafer 110 can effect the operation of both circuits 120 and 122. To reduce the likelihood of undesirable effects, the voltage on the central portion of wafer 110 Is usually held at a fixed value.

One problem with semiconductor devices is that It is difficult to form large resistive elements on a wafer without consuming large amounts of silicon surface area. The space requirements of large resistive elements are often so severe that external devices must be used. Thus, there is a need for a method of forming large resistive elements on a wafer that consume much less silicon surface area.

SUMMARY OF THE INVENTION

The present invention provides a method of forming a large resistive element on a dual-sided semiconductor device that substantially reduces the amount of silicon surface area required by the resistive element. As a result, the present invention allows large resistive elements to be integrated into semiconductor circuits.

The method of the present invention forms a dual-sided semiconductor device from a wafer that has a top surface, a bottom surface, and a dopant concentration. The method includes the step of forming a layer of masking material on the top surface of the wafer. The method also includes the step of patterning the layer of masking material to form a first opening in the layer of masking material that exposes a first region on the top surface.

The method further includes the step of forming a first opening in the top side of the wafer, and a doped region in the wafer between the first opening in the wafer and the bottom surface of the wafer after the layer of masking material has been patterned. The doped region has a top surface exposed by the first opening in the wafer, and a dopant concentration greater than the dopant concentration of the wafer.

The method additionally includes the step of forming a layer of conductive material to fill up the first opening in the wafer. The method also includes the step of planarizing the layer of conductive material to form a first conductive region formed over the doped region.

The present invention also includes a dual-sided semiconductor device that is formed on a wafer that has a top surface, a bottom surface, and a dopant concentration. The device includes a doped region that is formed in the wafer. The doped region, in turn, has a top surface, a bottom surface, and a dopant concentration that is greater than the dopant concentration of the wafer.

The device also includes an upper region of conductive material that is formed in the wafer over the top surface of the doped region. The upper region of conductive material has a top surface that is substantially planar with the top surface of the wafer.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 2A–8A are plan views, and FIGS. 2B–8B are cross-sectional views taken along lines 2B–8B, respectively, in FIGS. 2A–8A, respectively.

FIG. 9A is a plan view, and FIG. 9B is a cross-sectional view taken along line 9B in FIG. 9A.

FIGS. 10A–15A are plan views, and FIGS. 10B–15B are cross-sectional views taken along lines 10B–15B, respectively, in FIGS. 10A–15A, respectively.

DETAILED DESCRIPTION

Figure 1:
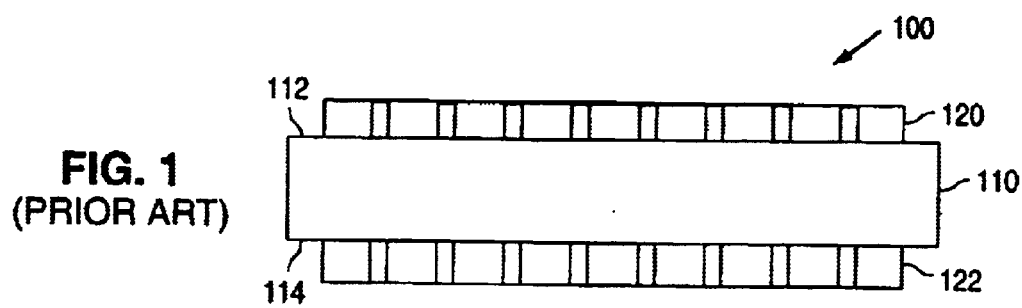
FIG. 1 is a cross-sectional drawing that illustrates a dual-sided semiconductor device 100.

FIGS. 2A–2B through 8A–8B are cross-sectional drawings that illustrate a method of forming a dual-sided semiconductor device in accordance with the present invention. As described in greater detail below, the present invention provides a method of forming a large resistive element on a silicon wafer that consumes very little area on the surface of the wafer.

The method of the present invention utilizes a wafer 200 that has a top surface 210, a bottom surface 212, and side-wall surfaces 214. Wafer 200 can be formed from a number of semiconductor materials such as, for example, silicon, germanium, gallium arsenide, aluminum-gallium arsenide, or indium phosphine.

Wafer 200 is doped to have an n-type or p-type conductivity, and is conventionally cleaned, polished, and prepared for processing except that each preparation step performed to top surface 210 is also performed to bottom surface 212. The wafer handling equipment used for loading, aligning, processing, and unloading wafer 200 may need to be modified to insure that top and bottom surfaces 210 and 212 are not molested before, during, and after processing. One method of dual-sided processing is disclosed in U.S. Pat. No. 4,782,028 to Farrier et al. which is hereby incorporated by reference.

Figures 2A, 3A:
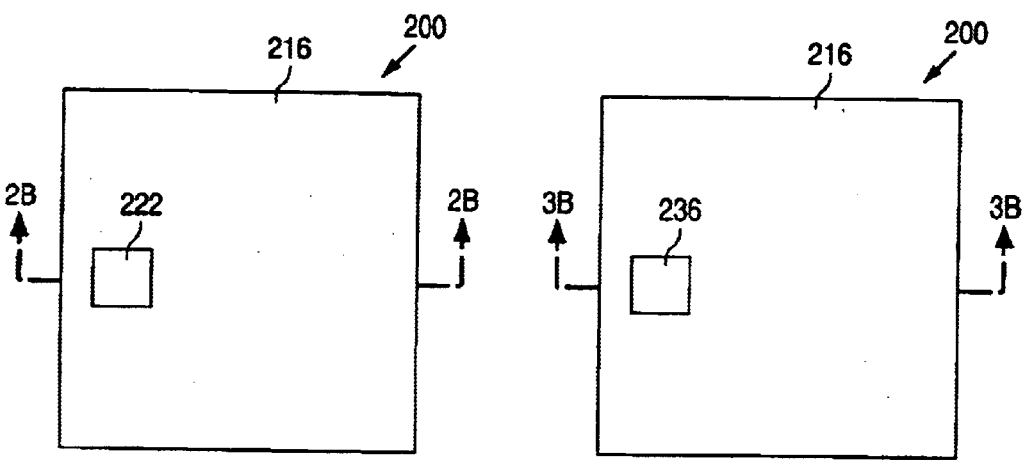
FIGS. 2A–2B through 8A–8B are cross-sectional drawings illustrating a method of forming a dual-sided semiconductor device in accordance with the present invention.
Figures 2B, 3B:
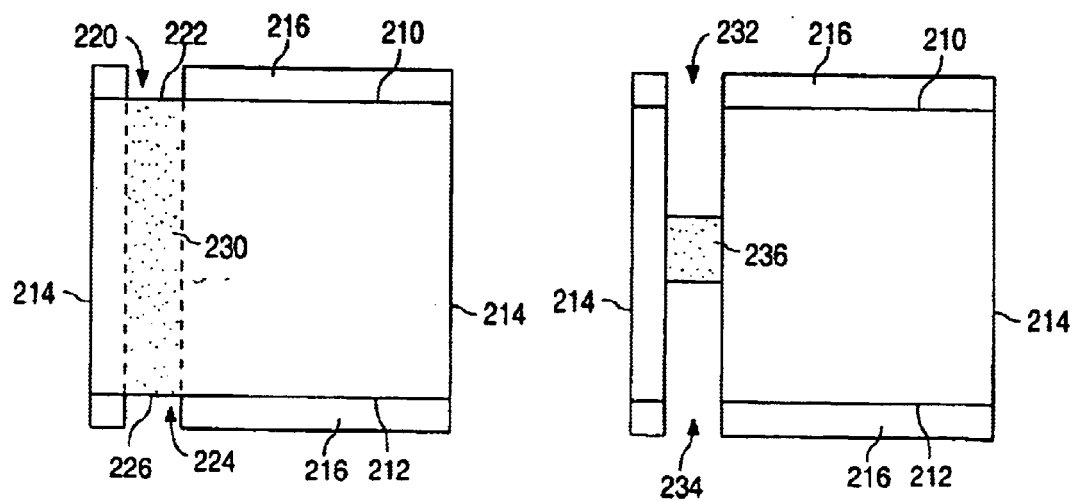

As shown in FIGS. 2A–2B, the method begins with the formation of a layer of masking material 216 on top surface 210 and bottom surface 212. Masking layer 216 is then patterned to form an opening 220 that exposes a region 222 of top surface 210, and an opening 224 that exposes a region 226 of bottom surface 212. Masking layer 216 can be formed as a hard mask from, for example, a layer of oxide, a layer of nitride, or a combination of layers.

Openings 220 and 224 are aligned with each other such that the left and right sides of opening 220 are substantially in register with the left and right sides of opening 224, respectively. Conventional techniques for the alignment of reticles or masks can be used to align openings 220 and 224 such as, for example, as disclosed in U.S. Pat. No. 3,939,579 to Schmidt and U.S. Pat. No. 5,530,552 to Mermagen et al. which are hereby incorporated by reference.

As shown in FIGS. 2A–2B, following the formation of openings 220 and 224, a dopant such as, for example, arsenic or phosphorous, is introduced into wafer 200 through openings 220 and 224. When the introduction is complete, the dopant extends continuously through wafer 200 from region 222 on top surface 210 to region 226 on bottom surface 212. The dopant forms a continuous region 230 through wafer 200 that has a dopant concentration that is greater than the dopant concentration of wafer 200. The dopant can be introduced into wafer 200 by, for example, diffusion and/or ion implantation.

Next, exposed region 222 on top surface 210 and exposed region 226 on bottom surface 212 are etched for a predetermined period of time. As shown in FIGS. 3A–3B, the etch defines an opening 232 in top surface 210 of wafer 200, an opening 234 in bottom surface 212 of wafer 200, and a doped resistive region 236 defined between openings 232 and 234. Following this, masking layer 216 is removed.

Alternately, wafer 200 can be first etched to form openings 232 and 234, followed by the introduction of the dopant to form doped resistive region 236. In addition, instead of using the same masking layer for both the diffusion and etching steps, separate masks can be used for the two steps.

Figure 4A:
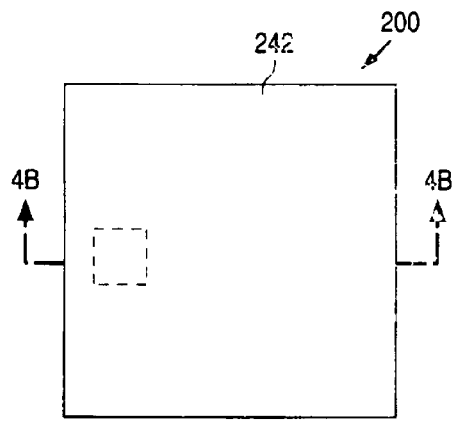
Figure 4B:
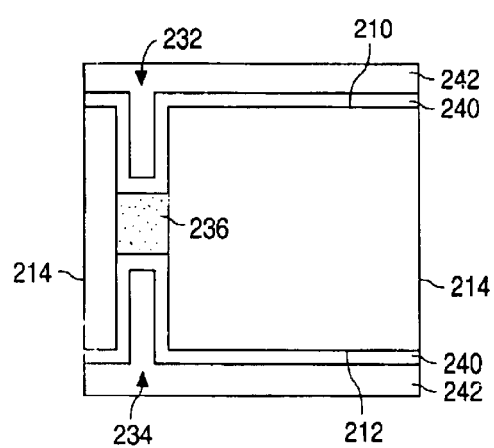

As shown in FIGS. 4A–4B, after doped resistive region 236 has been formed, a diffusion barrier layer 240 is formed on the exposed surfaces of doped region 236, the side walls of openings 232 and 234, and on the top and bottom surfaces 210 and 212. Following this, a layer of conductive material 242 such as, for example, aluminum, tungsten, copper, doped polyslilcon, or heavily doped amphorous silicon, is deposited to fill up openings 232 and 234 (amphorous silicon can be used with a smaller opening). Alternately, the formation of diffusion barrier layer 240 can be omitted so that conductive layer 242 is formed to be in direct contact with the exposed surfaces of doped resistive region 236 and wafer 200.

Figure 5A:
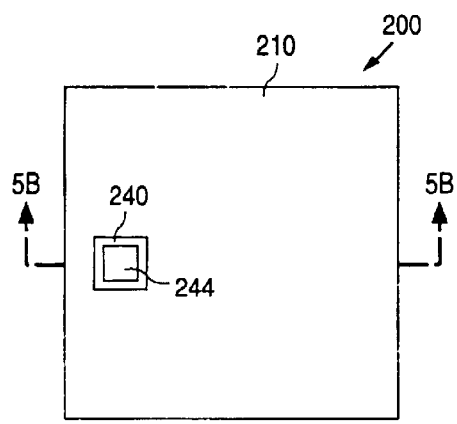
Figure 5B:
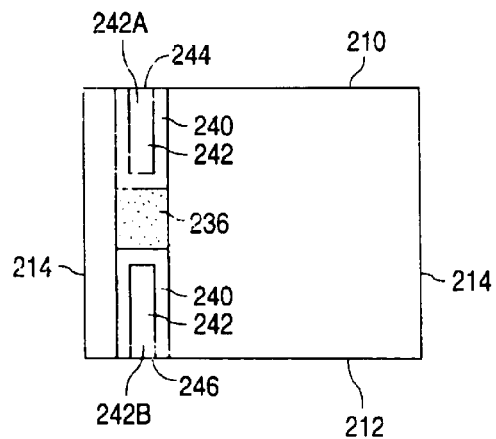

Next, as shown in FIGS. 5A–5B, wafer 200 is planarized to form an upper conductive region 242-A with an exposed region 244 of conductive layer 242 that is substantially planar with top surface 210, and a lower conductive region 242-B with an exposed region 246 of conductive layer 242 that is substantially planar with bottom surface 212.

Figure 6A:
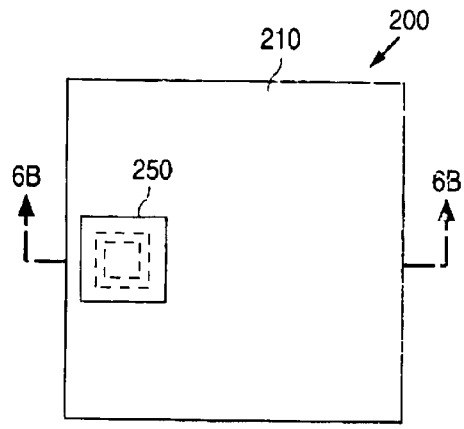
Figure 6B:
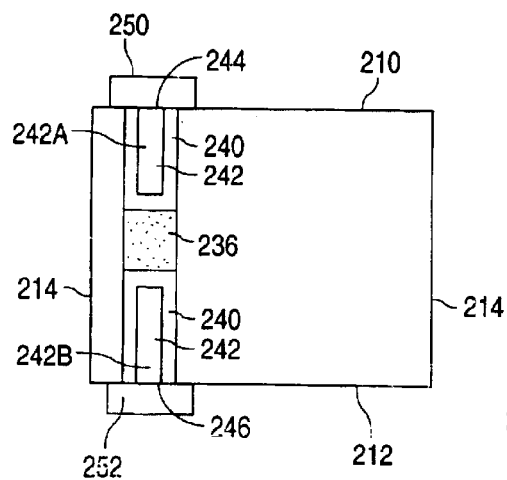

Following this, as shown in FIGS. 6A–6B, a top-side element 250 and a bottom-side element 252 are fabricated on top side 210 and bottom side 212, respectively, of wafer 200 in a conventional fashion, such as disclosed by Farrier. Elements 250 and 252 can include, for example, portions of transistors, resistors, capacitors, and contacts. (Wells and other doped regions can also be formed around diffusion barrier 240 or conductive layer 242.) Top-side element 250 and bottom-side element 252 may or may not be identical.

In accordance with a first embodiment of the present invention, as shown in FIGS. 6A–6B, top-side device 250 is formed to be directly connected to conductive region 242A, and bottom-side device 252 is formed to be directly connected to conductive region 242B.

Figure 7A:
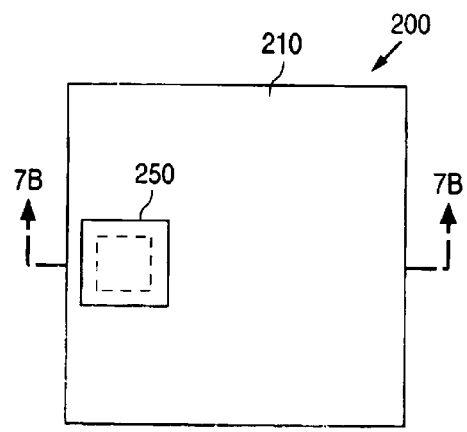
Figure 7B:
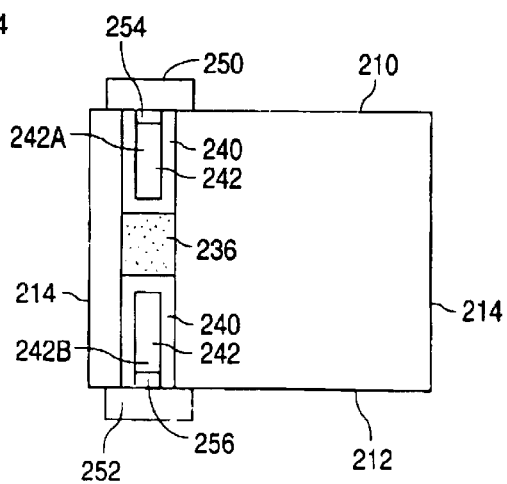

In a second embodiment of the present invention, as shown in FIGS. 7A–7B, top-side device 250 is formed to be connected to exposed region 244 via a diffusion barrier region 254, and bottom-side device 252 is formed to be connected to exposed region 246 via a diffusion barrier region 256. As a result, conductive regions 242A and 242B are both surrounded by a diffusion barrier.

Figure 8A:
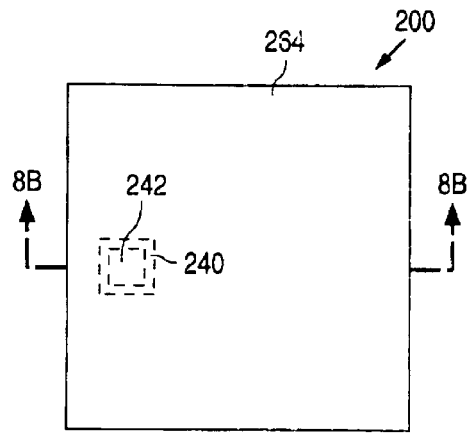
Figure 8B:
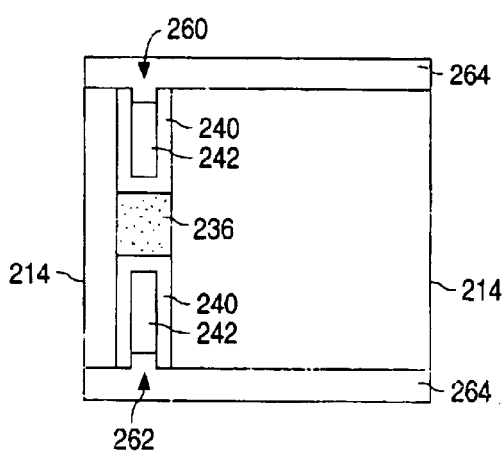

For example, as shown in FIGS. 8A–8B, after the planarization step shown in FIGS. 5A–5B, exposed regions 244 and 246 can be etched to form an opening 260 and an opening 262 in conductive layer 242. Following this, a diffusion barrier layer 264 can be formed to fill up openings 260 and 262. After this, diffusion layer 264 can be planarized to form diffusion barrier regions 254 and 256 of FIGS. 7A–7B. As a result, a top surface of diffusion barrier region 254 Is substantially planar with top surface 210, and a bottom surface of diffusion barrier region 256 is substantially planar with bottom surface 212.

In addition, in a third embodiment of the present invention, top-side device 250 is formed to be connected to exposed region 244 via diffusion barrier region 254, and bottom-side device 252 is formed to be directly connected to exposed region 246.

Thus, the present method forms a dual-sided semiconductor device on a wafer with a resistive path through the wafer. The resistance of the resistive path is largely determined by the resistance of doped resistive region 236. The resistance of doped resistive region 236 can be varied by varying the doping concentration and/or the size of doped resistive region 236. By forming the device with a resistive path through the wafer, large resistive elements can be formed that require very little silicon surface area.

Figure 9A:
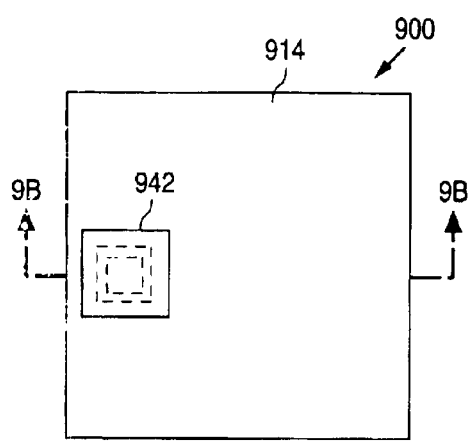
FIGS. 9A–9B are cross-sectional drawings illustrating a dual-sided semiconductor device 900 in accordance with the present invention.
Figure 9B:
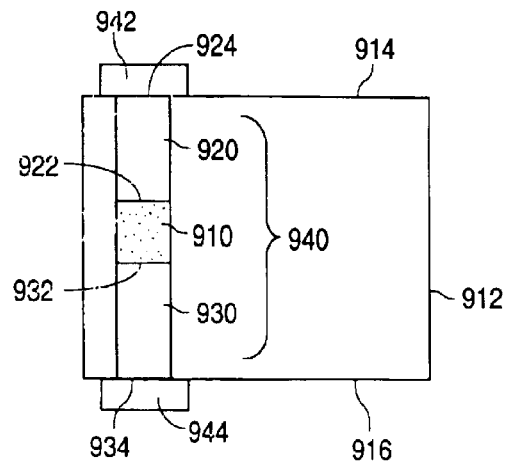

FIGS. 9A–9B show cross-sectional drawings that illustrate a dual-sided semiconductor device 900 in accordance with the present invention. As shown in FIGS. 9A–9B, device 900 has a doped resistive region 910 that is formed in a wafer 912 between a top surface 914 and a bottom surface 916 of wafer 912. In addition, device 900 has an upper conductive region 920 that is formed on a top surface 922 of doped resistive region 910. Region 920, which has a top surface 924, can be partly or completely surrounded by a diffusion barrier material as noted above.

Device 900 also has a lower conductive region 930 that is formed on a bottom surface 932 of doped resistive region 910. Region 930, which has a bottom surface 934, can also be partly or completely surrounded by a diffusion barrier material as noted above. Upper conductive region 920, doped resistive region 910, and lower conductive region 930 form a column 940 through wafer 912 that electrically connects top surface 914 of wafer 912 with bottom surface 916 of wafer 912.

As additionally shown In FIGS. 9A–9B, device 900 includes a first element 942 that is formed to contact top surface 924 of upper conductive region 920 (or the diffusion barrier material). Device 900 also includes a second element 944 that is formed to contact bottom surface 934 of lower conductive region 930 (or the diffusion barrier material). Elements 942 and 944, which may or may not be the same, can be, for example, transistors, resistors, capacitors, and contacts. (Wells and other doped regions can also be formed around regions 920 and 930.)

In operation, when no current flows through column 940, a voltage on top surface 924 of the upper conductive region 920 has a value that is substantially equal to a voltage on bottom surface 934 of the lower conductive region 930. When a current flows through column 940, a voltage on top surface 924 of the upper conductive region 920 has a value that differs from a voltage on bottom surface 934 of lower conductive region 930 by a difference value. The difference value, in turn, is equal to a magnitude of the current times a resistance of column 940. The resistance of column 940, in turn, is largely defined by the resistance of doped resistive region 910.

FIGS. 10A–10B through 15A–15B are cross-sectional drawings that illustrate a method of forming a dual-sided semiconductor device in accordance with an alternate embodiment of the present invention. The method of FIGS. 10A–10B through 15A–15B also utilizes wafer 200, and begins with the formation of a layer of masking material 1010 on top surface 210.

Masking layer 1010 is then patterned to form an opening 1012 that exposes a region 1014 of top surface 210. Unlike the prior method, bottom surface 212 is completely covered with masking material 1010.

Masking layer 1010 can be formed as a hard mask from, for example, a layer of oxide, a layer of nitride, or a combination of layers.

Figure 10A:
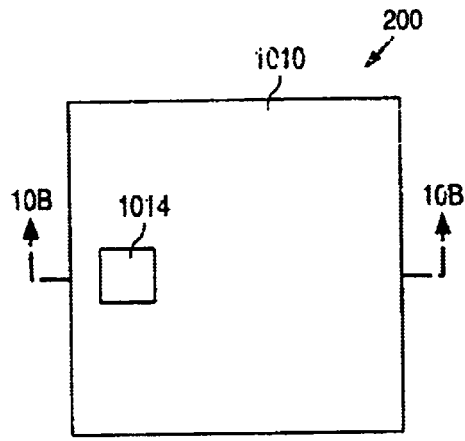
FIGS. 10A–10B through 15A–15B are cross-sectional drawings illustrating a method of forming a dual-sided semiconductor device in accordance with an alternate embodiment of the present invention.
Figure 10B:
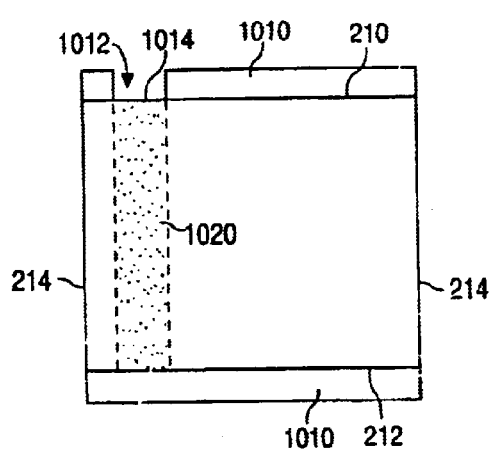

As shown In FIGS. 10A–10B, following the formation of opening 1012, a dopant such as, for example, arsenic or phosphorous, is introduced into wafer 200 through opening 1012. When the introduction is complete, the dopant extends continuously through wafer 200 from top surface 210 to bottom surface 212. The dopant forms a continuous region 1020 through wafer 200 that has a dopant concentration that is greater than the dopant concentration of wafer 200. The dopant can be Introduced into wafer 200 by, for example, diffusion and/or ion implantation.

Figure 11A:
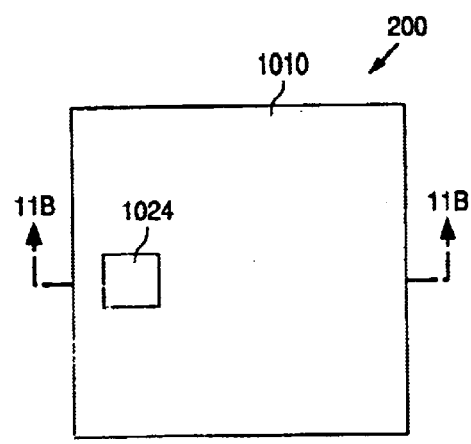
Figure 11B:
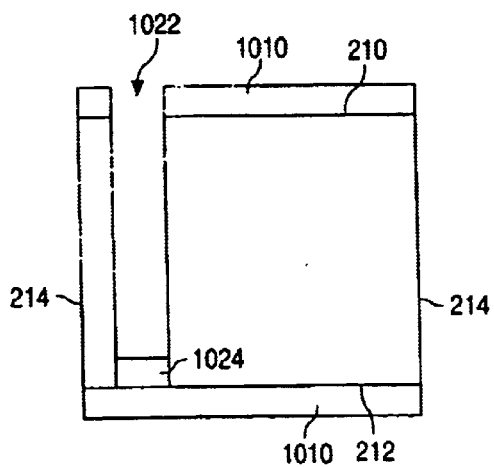

Next, as shown in FIGS. 11A–11B, exposed region 1014 on top surface 210 is etched for a predetermined period of time. The etch defines an opening 1022 that extends nearly through wafer 200, and a doped resistive region 1024 defined between opening 1022 and bottom surface 212. Following this, masking layer 1010 is removed.

Alternately, wafer 200 can be first etched to form opening 1022, followed by the introduction of the dopant to form doped resistive region 1024. In addition, instead of using the same masking layer for both the diffusion and etching steps, separate masks can be used for the two steps.

Figure 12A:
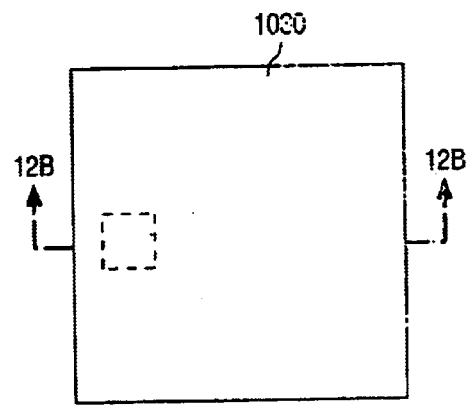
Figure 12B:
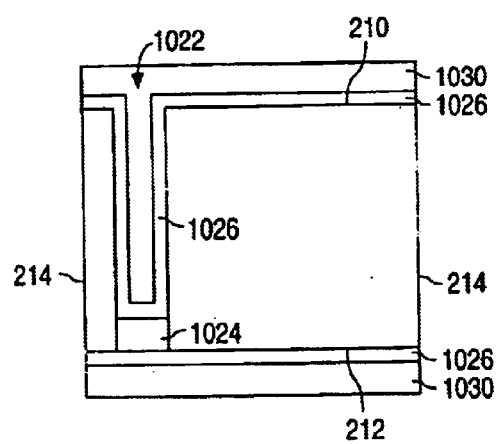

As shown in FIGS. 12A–12B, after doped resistive region 1024 has been formed, a diffusion barrier layer 1026 is formed on the exposed surfaces of doped resistive region 1024, the side walls of opening 1022, and on the top and bottom surfaces 210 and 212. Following this, a layer of conductive material 1030 such as, for example, aluminum, tungsten, copper, doped polyslilcon, or heavily doped amphorous silicon, is deposited to fill up opening 1022 (amphorous silicon can be used with a smaller opening). Alternately, the formation of diffusion barrier layer 1026 can be omitted so that conductive layer 1030 is formed to be In direct contact with the exposed surfaces of doped resistive region 1024 and wafer 200.

Figure 13A:
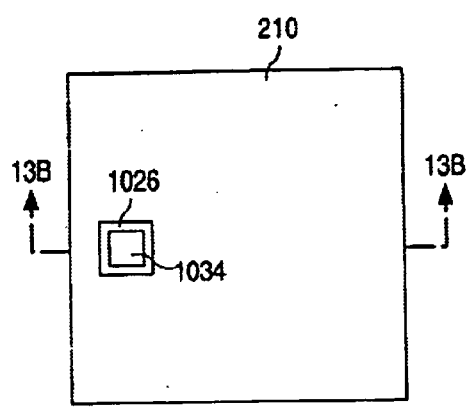
Figure 13B:
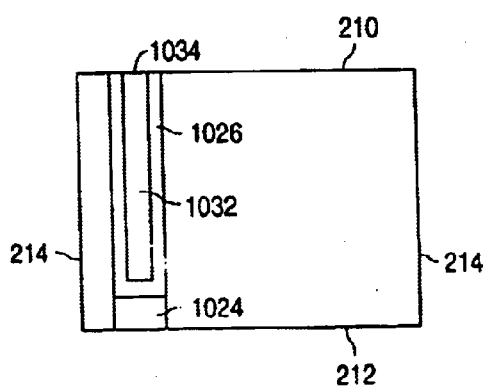
Figure 14A:
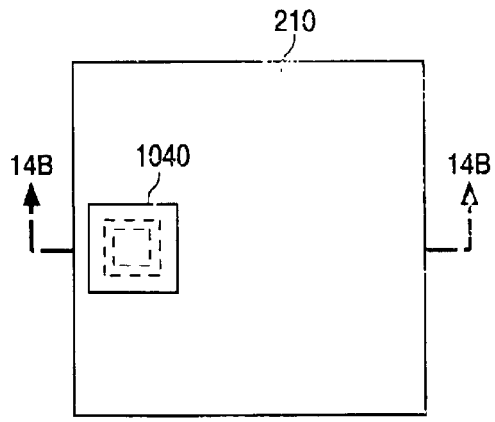
Figure 14B:
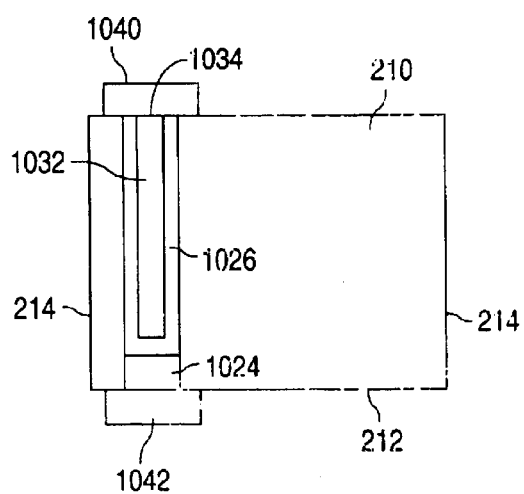

Next, as shown in FIGS. 13A–13B, wafer 200 Is planarized to form a conductive region 1032 with an exposed region 1034 that is substantially planar with top surface 210. Following this, as shown in FIGS. 14A–14B, a top-side element 1040 and a bottom-side element 1042 are fabricated on top side 210 and bottom side 212, respectively, of wafer 200 in a conventional fashion, such as disclosed by Farrier, to contact conductive region 1032 and doped resistive region 1024, respectively.

Elements 1040 and 1042 can Include, for example, portions of transistors, resistors, capacitors, and contacts. (Wells and other doped regions can also be formed around diffusion barrier 1026 or doped resistive region 1024.) Top-side element 1040 and bottom-side element 1042 may or may not be identical.

Figure 15A:
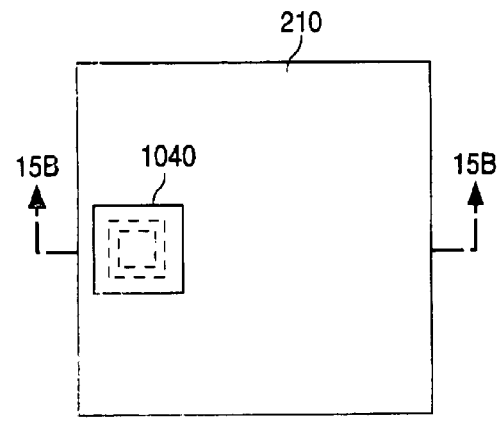
Figure 15B:
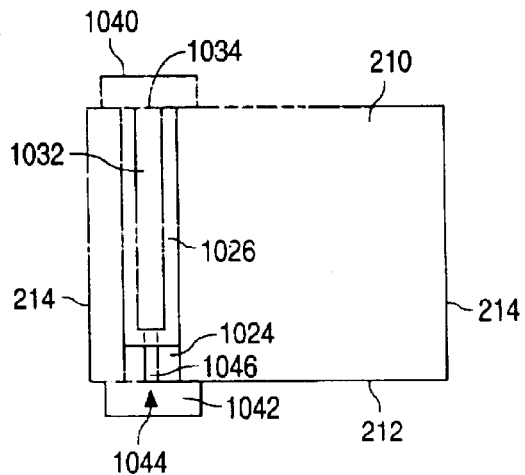

Alternately, as shown in FIGS. 15A–15B, an opening 1044 can be formed partially in doped region 1024, or completely through doped region 1024 to expose diffusion barrier 1026, or in both doped region 1024 and diffusion barrier 1026 to expose conductive region 1032. Following this, a layer of conductive material is formed and etched back using, for example, chemical-mechanical polishing to form a contact 1046. Once contact 1046 has been formed, bottom side element 1042 is formed either directly on contact 1046 or via a diffusion barrier.

Figure 16A:
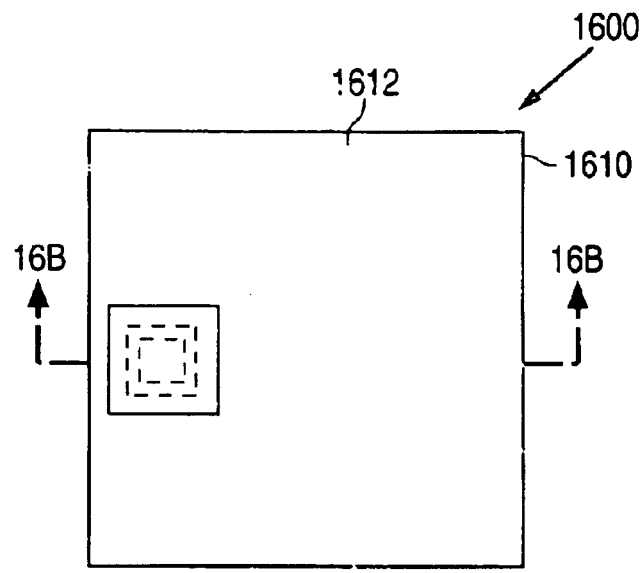
FIGS. 16A–16B are cross-sectional drawings illustrating a dual-sided semiconductor device 1600 in accordance with an alternate embodiment of the present invention.
Figure 16B:
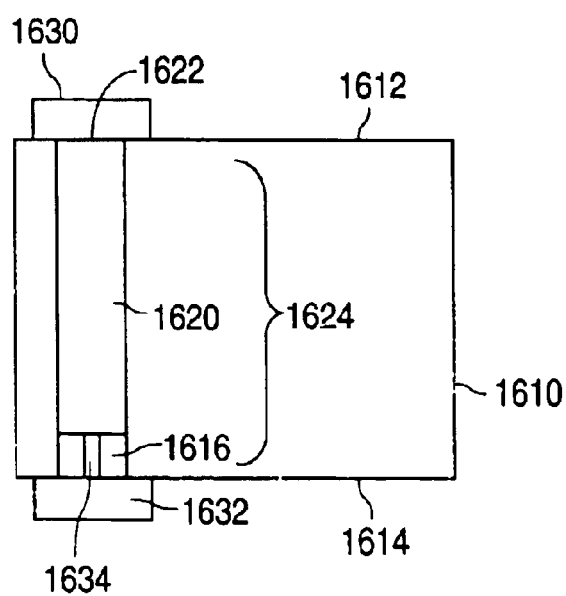

FIGS; 16A–16B show drawings that illustrate a dual-sided semiconductor device 1600 in accordance with an alternate embodiment of the present invention. As shown in FIGS. 16A–16B, device 1600 includes a wafer 1610 that has a top surface 1612 and a bottom surface 1614. In addition, device 1600 also has a doped resistive region 1616 that is formed in wafer 1610. Doped resistive region 1616 has a lower surface that Is substantially planar with bottom surface 1614.

Further, device 1600 has a conductive region 1620 that is formed on doped resistive region 1616. Region 1620, which has a top surface 1622, can be partly or completely surrounded by a diffusion barrier material as noted above. Conductive region 1620 and doped resistive region 1616 form a column 1624 through wafer 1610 that electrically connects top surface 1612 of wafer 1610 with bottom surface 1614 of wafer 1610.

As additionally shown in FIGS. 16A–16B, device 1600 includes a first element 1630 that is formed to contact conductive region 1620 (or the diffusion barrier material). Device 1600 also includes a second element 1632 that is formed to contact doped resistive region 1616. Alternately, second element 1632 can contact conductor 1620 via a contact 1634 formed partially or fully through doped resistive region 1616. Elements 1630 and 1632, which may or may not be the same, can be, for example, transistors, resistors, capacitors, and contacts. (Wells and other doped regions can also be formed around regions 1616 and 1620.)

In operation, when no current flows through column 1624, a voltage on the top surface of the conductive region 1620 has a value that is substantially equal to a voltage on the bottom surface of doped region 1616. When a current flows through column 1624, a voltage on the top surface of conductive region 1620 has a value that differs from a voltage on the bottom surface of doped region 1616 by a difference value. The difference value, in turn, is equal to a magnitude of the current times a resistance of column 1624. The resistance of column 1624, in turn, is largely due to the resistance of doped resistive region 1616.

It should be understood that various alternatives to the embodiment of the invention described herein may be employed in practicing the invention. For example, although the invention has been described in terms of forming a single conductive path through the substrate, a number of conductive paths through the substrate can also be formed.

In addition, although the invention has been described in terms of forming a resistive path prior to the formation of top-side device 250 (940) and bottom-side device 252 (942), the method of the present invention can be Integrated into the fabrication process of devices 250 and 252. For example, buried layers, wells, and epitaxial layers can be formed on top and bottom sides 210 and 212 prior to beginning the method of the present invention. Thus, it is intended that the following claims define the scope of the invention and that methods and structures within the scope of these claims and their equivalents be covered thereby.

What is claimed is:

1. A method of forming a dual-sided semiconductor device from a wafer, the wafer having a first surface, an opposing second surface, and a dopant concentration, the method comprising the steps of:
    forming a layer of masking material over the first surface of the wafer;
    patterning the layer of masking material to define a first region on the first surface; and
    forming an opening in the wafer and a doped region in the wafer, the opening forming exposed regions of the wafer, the doped region having a first surface exposed by the opening in the wafer, dopant concentration that is greater than the dopant concentration of the wafer, and lying spaced apart from and between the first surface and the second surface of the wafer.

2. The method of claim 1 and further comprising the step of forming a layer of conductive material in the opening form a first conductive region that contacts the doped region.

3. The method of claim 2 and further comprising the steps of:
    forming a layer of masking material on the second surface of the wafer to expose a second region on the second surface of the wafer, the first and second regions being substantially vertically aligned,
    forming an opening in the second surface of the wafer to expose the doped region in the wafer, the doped region having a second surface exposed by the opening in the second surface of the wafer; and
    forming a layer of conductive material in the opening in the second surface of the wafer to form a second conductive region that contacts the doped region.

4. The method of claim 2 and further comprising the step of forming a first device that contacts the first conductive region, and a second device that contacts the second conductive region.

5. The method of claim 2 wherein the step of forming an opening in the wafer and a doped region in the wafer includes the steps of:
    forming a layer of masking material on the second surface of the wafer to expose a second region on the second surface of the wafer, the first and second regions being substantially vertically aligned;
    introducing a dopant into the wafer through the first and second regions, the dopant extending continuously through the wafer from the first region to the second region, and forming a continuous region through the wafer that has a dopant concentration greater than a dopant concentration of the wafer; and
    etching the first and second regions for a predetermined period of time after the dopant has been introduced to define a first opening in the first surface of the wafer, a second opening in the second surface of the wafer, and the doped region there between.

6. The method of claim 2 wherein the step of forming an opening in the wafer and a doped region in the wafer includes the steps of:
    forming a layer of masking material on the second surface of the wafer to expose a second region on the second surface of the wafer, the first and second regions being substantially vertically aligned;
    introducing a dopant into the wafer through the first and second regions, the dopant extending continuously through the wafer from the first region to the second region;
    removing the layer of masking material after the dopant has been introduced;
    forming a protective layer on the first surface and the second surface of the wafer after the layer of masking material has been removed;
    patterning the protective layer to expose the first region of the first surface, and the second region of the second surface; and
    etching the first and second regions for a predetermined period of time after the protective layer has been patterned to define a first opening in the first surface of the wafer, a second opening in the second surface of the wafer, and the doped region there between.

7. The method of claim 2 wherein the step of forming an opening in the wafer and a doped region in the wafer includes the steps of:
    forming a layer of masking material on the second surface of the wafer to expose a second region on the second surface of the wafer, the first and second regions being substantially vertically aligned;
    etching the first and second regions for a predetermined period of time to define a first opening in the first surface of the wafer, a second opening in the second surface of the wafer, and a remaining region there between;
    removing the layer of masking material after the etch has been completed;
    forming a protective layer on the first surface and the second surface of the wafer after the layer of masking material has been removed;
    patterning the protective layer to expose a top surface of the remaining region, and a bottom surface of the remaining region; and
    introducing a dopant into the wafer through the first and second openings, the dopant extending continuously through the remaining region.

8. The method of claim 2 and further comprising the step of forming a diffusion barrier on the doped region and exposed regions of the wafer.

9. A method of forming a dual-sided semiconductor device from a wafer, the wafer having a first surface, an opposing second surface, and a dopant concentration, the method comprising the steps of:

forming a layer of masking material over the first surface of the wafer;

patterning the layer of masking material to define a first region on the first surface of the wafer;

forming a layer of masking material on the second surface of the wafer to expose a second region on the second surface of the wafer, the first and second regions being substantially vertically aligned;

etching the first and second regions for a predetermined period of time to define a first opening in the first surface of the wafer, a second opening in the second surface of the wafer, and a remaining region there between;

introducing a dopant into the wafer through the first and second openings, the dopant extending continuously through the remaining region to form the doped region, and having a dopant concentration that is greater than the dopant concentration of the wafer; and forming a layer of conductive material in the first opening in the wafer to form a first conductive region that contacts the doped region.

10. A method of forming a dual-sided semiconductor device from a wafer, the wafer having a first surface, an opposing second surface, and a dopant concentration, the method comprising the steps of:

forming a layer of masking material over the first surface of the wafer;

patterning the layer of masking material to define a first region on the first surface;

forming an opening in the wafer and a doped region in the wafer, the opening forming exposed regions of the wafer, the doped region having a first surface exposed by the opening in the wafer, a dopant concentration that is greater than the dopant concentration of the wafer, and a second surface substantially planar with the second surface of the wafer, the first surface of the doped region and the second surface of the wafer being roughly parallel.

11. A method of forming a dual-sided semiconductor device from a wafer, the wafer having a first surface, an opposing second surface, and a dopant concentration, the method comprising the steps of:

forming a layer of masking material over the first surface of the wafer;

patterning the layer of masking material to define a first region on the first surface;

introducing a dopant into the wafer through the first region, the dopant extending continuously through the wafer from the first surface of the wafer to the second surface of the wafer; and etching the first region for a predetermined period of time after the dopant has been introduced to define an opening in the wafer, and a doped region between the opening and the second surface of the wafer, the doped region having a surface substantially planar with the second surface of the wafer, and a dopant concentration that is greater than the dopant concentration of the wafer; and forming a layer of conductive material in the first opening in the wafer to form a first conductive region that contacts the doped region.

12. A method of forming a dual-sided semiconductor device from a wafer, the wafer having a first surface, an opposing second surface, and a dopant concentration, the method comprising the steps of:

forming a layer of masking material over the first surface of the wafer;

patterning the layer of masking material to define a first region on the first surface;

etching the first region for a predetermined period of time to define the opening in the wafer, and a remaining region between the opening and the second surface;

introducing a dopant into the wafer, the dopant extending continuously through the remaining region to form the doped region, the doped region having a surface substantially planar with the second surface of the wafer, and a dopant concentration that is greater than the dopant concentration of the wafer; and forming a layer of conductive material in the first opening in the wafer to form a first conductive region that contacts the doped region.

13. A method of forming a dual-sided semiconductor device from a wafer, the wafer having a first surface, an opposing second surface, and a dopant concentration, the method comprising the steps of:

forming a layer of masking material over the first surface of the wafer;

patterning the layer of masking material to define a first region on the first surface;

forming an opening in the wafer and a doped region in the wafer, the opening forming exposed regions of the wafer, the doped region having a surface exposed by the opening in the wafer, a dopant concentration that is greater than the dopant concentration of the wafer, and a surface substantially planar with the second surface of the wafer;

forming a layer of conductive material in the opening in the wafer to form a first conductive region that contacts the doped region; and forming a first device that contacts the first conductive region, and a second device that contacts the doped region.

14. The method of claim 13 and further comprising the step of forming a contact through the doped region to make an electrical connection with the first conductive region.

15. The method of claim 14 and further comprising the step of forming a first device that contacts the first conductive region, and a second device that contacts the contact.

* * * * *

UNITED STATES PATENT AND TRADEMARK OFFICE
CERTIFICATE OF CORRECTION

PATENT NO. : 6,784,099 B1
DATED : August 31, 2004
INVENTOR(S) : Naem

It is certified that error appears in the above-identified patent and that said Letters Patent is hereby corrected as shown below:

Column 1,
Line 46, delete "Is" and replace with -- is --.
Line 47, delete "It" and replace with -- it --.

Column 3,
Line 64, delete "polslilcon" and replace with -- polysilicon --.

Column 4,
Line 39, delete "Is" and replace with -- is --.

Column 5,
Lines 8 and 44, delete "In" and replace with -- in --.
Line 52, delete "Introduced" and replace with -- introduced --.

Column 6,
Line 5, delete "polyslilcon" and replace with -- polysilicon --.
Line 9, delete "In" and replace with -- in --.
Line 12, delete "Is" and replace with -- is --.
Line 21, delete "Include" and replace with -- include --.
Line 44, delete "Is" and replace with -- is --.

Column 7,
Line 19, delete "Integrated" and replace with -- integrated --.
Line 39, after "wafer" insert -- a --.
Line 45, before "form" insert -- to --.
Line 59, delete "2" and replace with -- 3 --.

UNITED STATES PATENT AND TRADEMARK OFFICE
CERTIFICATE OF CORRECTION

PATENT NO. : 6,784,099 B1
DATED : August 31, 2004
INVENTOR(S) : Naem

It is certified that error appears in the above-identified patent and that said Letters Patent is hereby corrected as shown below:

<u>Column 9,</u>
Line 47, delete "laver" and replace with -- layer --.

Signed and Sealed this

Seventh Day of December, 2004

JON W. DUDAS
*Director of the United States Patent and Trademark Office*